Nov. 26, 1968 H. RÜCHARDT ET AL 3,413,530

AMPLIFYING TRANSISTOR DEVICE FOR REGULATING CIRCUITS

Filed Nov. 30, 1965 2 Sheets-Sheet 1

Nov. 26, 1968 H. RÜCHARDT ET AL 3,413,530

AMPLIFYING TRANSISTOR DEVICE FOR REGULATING CIRCUITS

Filed Nov. 30, 1965 2 Sheets-Sheet 2

United States Patent Office 3,413,530

Patented Nov. 26, 1968

3,413,530
AMPLIFYING TRANSISTOR DEVICE FOR REGULATING CIRCUITS

Hugo Rüchardt, Gauting, and Hans Hargasser and Winfried Meer, Munich, Germany, assignors to Siemens Aktiengesellschaft, a corporation of Germany Filed Nov. 30, 1965, Ser. No. 510,571
Claims priority, application Germany, Dec. 1, 1964, S 94,395
6 Claims. (Cl. 317—235)

ABSTRACT OF THE DISCLOSURE

An amplifying transistor device for reducing the effects of cross modulation, having a collector region on one face and having respective emitter and base regions with respective emitter and base electrodes located on the opposite face. An auxiliary electrode forming a barrier-free junction with the base region is located near the emitter at its side away from the base electrode. A voltage source connected across the auxiliary and base electrodes establishes a transverse field in the base region which provides a current displacement for the charge carriers injected from the emitter region into the base region. The dopant concentration ($N_C$) in the collector region suffices to cause a collector current of at most 10 ma. to correspond to a current density larger than the product of $v_g \cdot N_c \cdot q$, wherein $v_g$ denotes the limit velocity for the charge carriers injected from the emitter region into the base region at high field strength, $N_C$ is the dopant density in the collector region, and $q$ denotes the elementary charge. As a result, an increase in collector current reduces the amplifying gain.

Our invention relates to amplifying transistor devices for use in regulating circuits and has for its principal object to minimize the non-linearity of the transistor amplifying characteristic to thereby reduce cross modulation.

The invention will be described with reference to the accompanying drawing in which FIGS. 1–3 are explanatory graphs;

FIG. 4*a* shows by way of example a regulating transistor according to the invention by a plan view, and FIG. 4*b* is a corresponding side elevation;

A high-frequency transistor amplifier may exhibit cross modulation due to a non-linear input characteristics. Cross modulation is the pheonmenon that when a signal from a transmitter (useful or main transmitter) is being received the modulation of a different transmitter (interfering or transient transmitter) operating on a different carrier frequency appears superimposed as noise upon the useful signal, whereas the modulation of the transient transmitter is not discernible when the carrier wave of the useful signal is absent. Such interference, therefore, cannot be eliminated by any selective circuit means, such as intermediate-frequency filters, in the receiving circuitry.

This poses the problem of linearizing the input characteristic of an amplifying transistor within a limited control range. The problem is aggravated by the requirement that the transistor should furnish a regulatable power amplification.

The power amplification of a regulating transistor depends upon the operating point adjusted within a given operating characteristic. Regulatability of a transistor is constrainedly accompanied by non-linearity of the input characteristic. Regulating transistors are operated in regulating circuits, in which a change in amplification is obtained by the fact that the transconductance decreases with increasing emitter or collector current.

High-frequency regulating transistors are supposed to attain a highest feasible level of permissible noise voltage within the desired working range. The term "level of permissible noise voltage" denotes the amount of signal voltage required of the transient transmitter to effect a 1% modulation of wave.

Figures 1, 2, 3, 4A, 4B, 5, 7, 8:
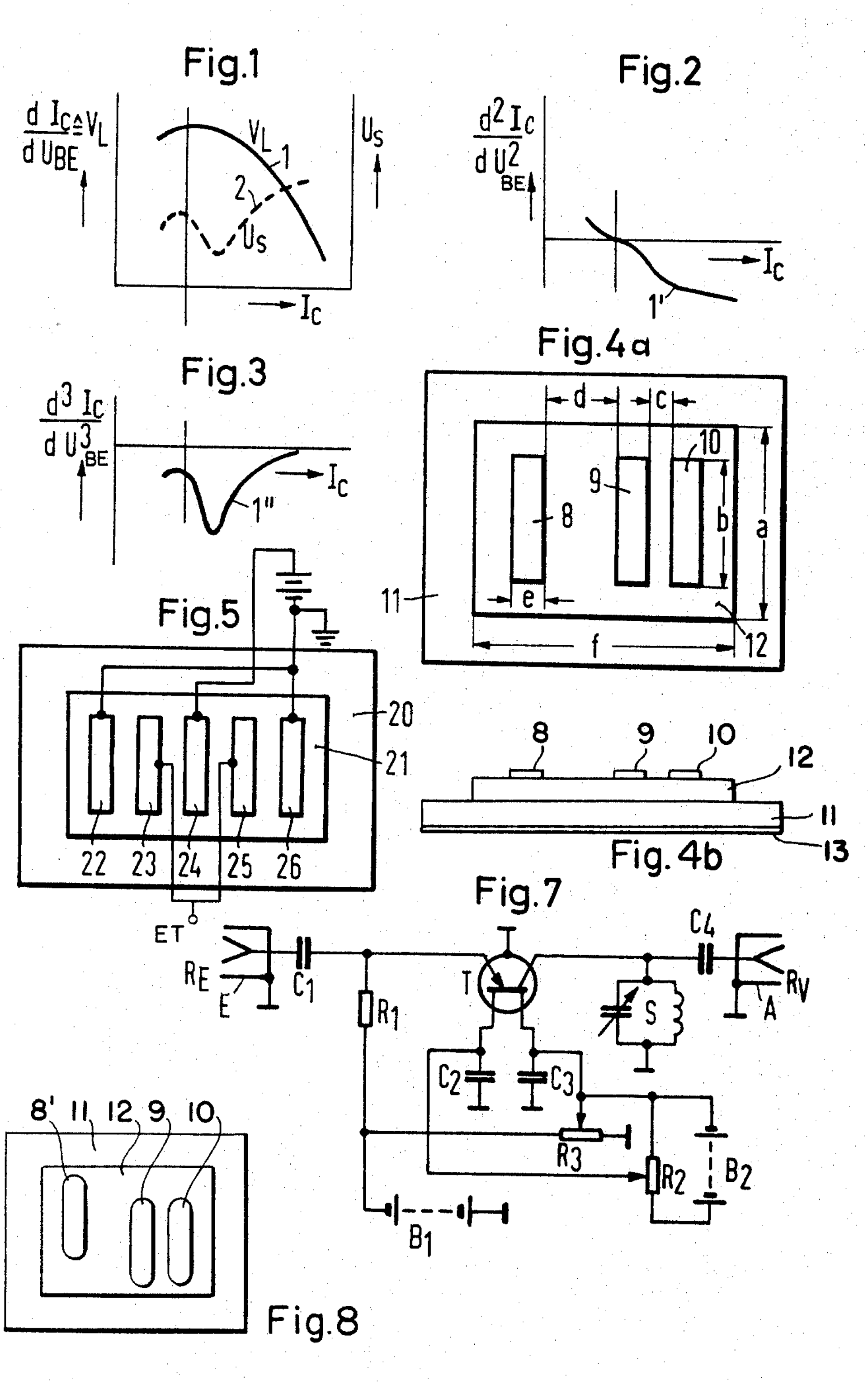
FIG. 5 is a plan view of another embodiment of such a transistor.
FIG. 7 is the diagram of a measuring circuit employed for obtaining the measuring results represented in FIG. 6.
FIG. 8 is a plan view of another embodiment of a transistor according to the invention.

The non-linearity of the amplification of a transistor is expressed by the function $V_L = F(I_C)$. A substantially similar relation also applies to the differential transconductance. The relation between output current and input voltage is satisfactorily approximated by a series of exponential terms:

$$I_C = I_o + \frac{dI}{DU}\frac{U}{1!} + \frac{d^2I}{dU^2}\frac{U^2}{2!} + \frac{d^3I}{dU^3}\frac{U^3}{3!} + \dots$$

wherein U denotes the input signal voltage. When measuring cross modulation, this signal U, supplied to the transistor, is furnished from a non-modulated useful transmitter and a 100% amplitude-modulated interfering transmitter. Calculation (not here reproduced) shows that the signal U first reaches at the term of the third order an output current whose frequency is that of the useful transmitter and whose modulation is that of the interfering transmitter. Graphically shown in FIGS. 1, 2 and 3 are the transconductance as a function of collector current for a regulating transistor, the first derivative and the second derivative of the transconductance function. The absicca in each graph represents collector current $I_C$. The ordinate represents the derivative values shown in each graph at the left. The transconductance $dI_C/dU_{BE}$ is approximately proportional to the amplification $V_L$. In FIG 1, therefore, curve 1 also represents in good approximation the power amplification characteristic. Curve 2 shows the configuration of the permissible spurious voltage $U_S$, likewise as a function of the collector current $I_C$. $U_S$ is the voltage of a modulated interfering transmitter which produces a defined modulation of a useful transmitter. The spurious voltage permissible or required for producing a given disturbance (noise) of the signal received from the useful transmitter is to be as high as feasible within the entire regulating range of a regulated transistor. Of particular importance for receivers is the increase in permissible spurious voltage with increasing regulation, in comparison with the operating point at maximal amplification.

The curve 1' in FIG. 2 exhibits the first derivative of the transconductance function which is proportional to the first derivative of the amplifying characteristic. The curve 1'' in FIG. 3 represents the curvature of the transconductance function which is proportional to the curvature of the amplifying characteristic. The curvature of the amplifying characteristic constitutes a measure of the cross modulation and hence of the permissible spurious voltage.

It is thus a more specific object of the present invention to minimize as much as possible the curvature in the amplifying characteristic of a regulating transistor in order to thereby increase the permissible or required spurious (noise) voltage over the entire regulating range of the transistor.

To this end, and in accordance with our invention, we employ a transistor having an emitter region, a base region and a collector region, in which an emitter electrode and a base electrode are arranged on a surface facing away from the collector region of the semiconductor body forming the transistor, this body preferably consisting of a wafer or platelet. It is essential to the invention that in such a transistor the dopant density $N_C$ in the collector region is so chosen that a collector current $I_C$ of a few milliamps, namely at most 10 ma., causes the current density $j_c$ to be larger than the product of $v_g \cdot N_C \cdot q$, wherein $v_g$ is the limit velocity for the charge carriers injected from the emitter region into the base region at high field strength (3 to $6 \cdot 10^6$ cm./sec.), $N_C$ is the dopant density in the collector region, and $q$ is the elementary charge. Under these conditions, a change in collector current $I_C$ alters the effective width of the base region and hence also the high-frequency amplifying gain. Furthermore, we provide the transistor with an auxiliary electrode which forms a barrier-free contact with the base region and is likewise located near the emitter electrode but at the emitter side away from the base electrode. We provide the base electrode and the auxiliary electrode with respective terminal connections for electrically connecting them with each other through a direct voltage source so that, during transistor operation, a transverse current flows through the base region and effects a current displacement for the charge carriers injected from the emitter region into the base region.

For a given value of collector current $I_C$, the current density $j_c$ depends upon the injecting emitter area. Since the emitter area affects the electrical parameters of the transistor, particularly the limit frequency, it follows that the dopant density $N_C$ will assume different values depending upon the electrical data, particularly the particular frequency range, for which the transistor is dimensioned.

The transistor may be so designed that the collector region has two portions of which one is adjacent to the base region and has the dopant density $N_C$, whereas the other portion is adjacent to the collector electrode and has a lower resistivity.

The relation concerning the dopant density results from the following consideration. The selective high-frequency amplification of a transistor is given by the equation $$V_L = \frac{f_T}{f^2 r_{bb'} C_{cb'}} \quad (2)$$

In this equation, $r_{bb'}$ denotes the base spreading resistance; $C_{cb'}$ denotes the portion of the collector capacitance in series with $r_{bb'}$; $f$ is the frequency of operation, and $f_T$ the frequency value when the amplification in common configuration is equal to unity. The high-frequency amplification $V_L$ for a given frequency $f$ may be reduced by reducing the numerator or by increasing the denominator in the equation. For high frequencies, the input and output impedances of a transistor are largely determined by the base spreading resistance and the above-indicated share of the collector capacitance. A change of these magnitudes for the purpose of regulating the amplification leads to matching changes and to detuning of preceding or following filters. An optimal change in amplification at a lowest change in impedance can be attained by changing the transfer magnitude $f_T$. At relatively large currents, $f_T$ is inversely proportional to the base transmit time:

$$f_T \sim \frac{1}{2\pi \tau_L} \quad (3)$$

wherein $\tau_L$ denotes the base transit time. The carrier transit time is a square function of the width of the field-free base traversed by diffusion:

$$\tau_L \sim \frac{w^2}{D} \quad (4)$$

Herein D denotes the diffusion constant of the minority charge carriers in the base space and $w$ the electrically active width (thickness) of the base region. The collector space charge zone, forming in the operation of the transistor and commencing at the collector p–n junction, as a space-charge density $\rho_c$ proportional to the dopant density $N_C$ in the high resistivity region between base and collector. $\rho_c$ is determined by the equation $$\rho_c = q \cdot N_C$$

wherein $q$ denotes the elementary charge.

Assume that there is injected from the emitter into the base a current which passes into the collector, the current density ($j_c$) of the injection being $$j_c > v_g \cdot N_C \cdot q$$

wherein $v_g$ denotes the limit speed for the charge carriers in the semiconductor at high field strengths amounting to about 3–6 · $10^6$ cm./sec. Under such opearting conditions, the original collector space-charge zone is reversely charged or displaced. This results in widening the thickness $w$ of the field-free, electrically effective base region. It follows from the approximation 4 that the increase in effective base thickness $w$ prolongs the charge-carrier transit time. This, according to Equations 3 and 2, results in reducing the high-frequency amplification. This widening of the base thickness and the accompanying reduction in high-frequency amplifying gain increases with increasing collector current $I_C$. The amount of base widening becomes larger, the thicker the collector region is chosen. For low power losses, as well as for stability of noise and constancy of impedance, it is further essential that the dopant concentration $N_C$ in the collector region be chosen so low that the base widening occurs with a few milliamps of the entire collector current, which is determined by the relation $$I_C = \int_0^{F_E} j_c dF_E \quad (7)$$

In this equation, $F_E$ denotes the injecting emitter area. For uniform injection over the entire emitter area, the Equation 7 becomes simplified to $I_C = j_c F_E$.

Investigation has shown that by collector widening a further reduction in curvature of the amplifying characteristic and thus an increase in permissible spurious voltage, can be attained by designing the transistor to provide a means for effecting a substantial current displacement for the charge carriers injected from the emitter region into the base region. This is achieved by providing the transistor with the above-mentioned auxiliary electrode which forms a barrier-free contact with the base and is likewise located near the emitter electrode but on the side away from the base electrode, the base electrode and the auxiliary electrode being provided with terminals or leads by means of which they are connected with each other through a current source when the transistor is in operation. During such operation, therefore, a transverse current flows through the base. This transverse current may produce a current displacement zone for the charge carriers injected from the emitter into the base region, since the flow potential at the emitter p-n junction, which causes the injection, becomes a non-constant monotonous function of the locality by virtue of the transverse current.

The poling of the direct current thus flowing through the base layer or region is determined by the resulting course of the permissible spurious (noise) voltage for 1% cross modulation as a function of the particular amplifying gain. In principle, positive and negative polarities are possible. By virtue of the base transverse current supplied through the additional electrode, the cross-modulation behavior of the transistor is considerably improved. A transistor made according to the invention affords within a large regulating range an increase in permissible spurious voltage $U_s$ and consequently secures a corresponding reduction in cross modulation that is largely independent of specimen stray, i.e. inevitable differences between different specimens of a manufacturing series. As mentioned, the transistors are operated in regulating circuits. These can be in common base configuration as well as in common emitter configuration. The fundamental manufacturing method employed for making the transistor is likewise of minor significance. For example, a transistor may be produced with or without use of the epitaxial process by mesa, planar or POB (push-out base) techniques.

The manufacture can be started with a uniformly doped semiconductor crystalline body possessing the dopant concentration $N_C$ desired in the collector region. The known diffusion and alloying methods may be employed for providing such a crystalline body with the emitter region and the base region. However, the collector region may also be produced epitaxially and in this case generally consists of a low resistivity portion directly adjacent to the collector electrode and a relatively high resistivity portion which is adjacent to the base region and possesses the dopant concentration $N_C$.

The embodiment of a regulating transistor according to the invention exemplified in FIGS. 4*a* and 4*b* is produced from germanium by the known mesa technique and has a p-n-p sequence of acceptor and donor doped regions. The semiconductor body 11 of the transistor has a mesa 12 on top of which the emitter contact 9 and the base contact 10, as well as an auxiliary electrode 8, each of them strip-shaped, are deposited. The present example has the following dimensions. The length of each strip 8, 9, 10 is $b=40\mu$. The width of each strip is $e=15\mu$. The dimensions of the mesa 12 are $a=60\mu$ and $f=90\mu$. The distance between emitter 9 and base electrode 10 is $c=6\mu$. The distance *d* between emitter 9 and auxiliary electrode 8 is $20\mu$. The midpoints of the three electrodes 8, 9, 10 are located on a straight geometric line. The midpoint of the auxiliary electrode, however, may also be located outside of the connecting line between the midpoints of emitter and base electrodes, this being the case in the embodiment shown in FIG. 8, where the auxiliary electrode is denoted by 8' and the items denoted by 9, 10, 11, 12 correspond to those denoted in FIG. 4*a* by the same numerals respectively.

Essential to the auxiliary electrode 8 or 8' is the fact that it is located on the emitter side away from the base electrode 10 on the same face of the semiconductor crystal. In other respects the auxiliary electrode may be placed in any desired manner relative to the emitter electrode 9. The position of the auxiliary electrode relative to the emitter and the base electrode is so chosen as to secure optimal regulating performance. This, in a particular case, depends mainly upon the doping of the high resistivity region located between base and collector, and also upon the magnitude of the base transverse current, this current being in the order of magnitude of milliamps (ma.). For example, the transverse current may vary between 2 and 50 ma.

According to another embodiment of the invention, several base electrodes, all or some of them short-circuited among themselves, may be provided. Furthermore, the additional or auxiliary electrode may simultaneously constitute a base electrode of the transistor. This will be further elucidated with reference to the embodiment exemplified in FIG. 5.

According to FIG. 5, the semiconductor crystalline body 20 is provided with a mesa 21 which carries on its top a number of strip-shaped electrodes 22, 23, 24, 25, 26. According to an embodiment of the invention, the two electrodes 23 and 25 may constitute the emitter electrodes of the transistor and may be short-circuited with each other by being both connected to an emitter terminal ET as shown. The electrode 24 may be considered as the auxiliary electrode, and the electrodes 22 and 26 are the base electrodes and are short-circuited with each other. The base voltage is effective between electrodes 22/26 on the one hand, and the centrally located electrode 24 on the other hand. For this purpose, the base electrodes 22 and 26 are provided with connector leads which extend to the outside in insulated relation to the other components of the transistor; and the direct voltage required for passing a base transverse current through the transistor is connected between the electrodes 22/26 and 24 as shown. The electrodes 22 and 26 become less effective to function as a base electrode as the transverse current increases.

Figure 6:
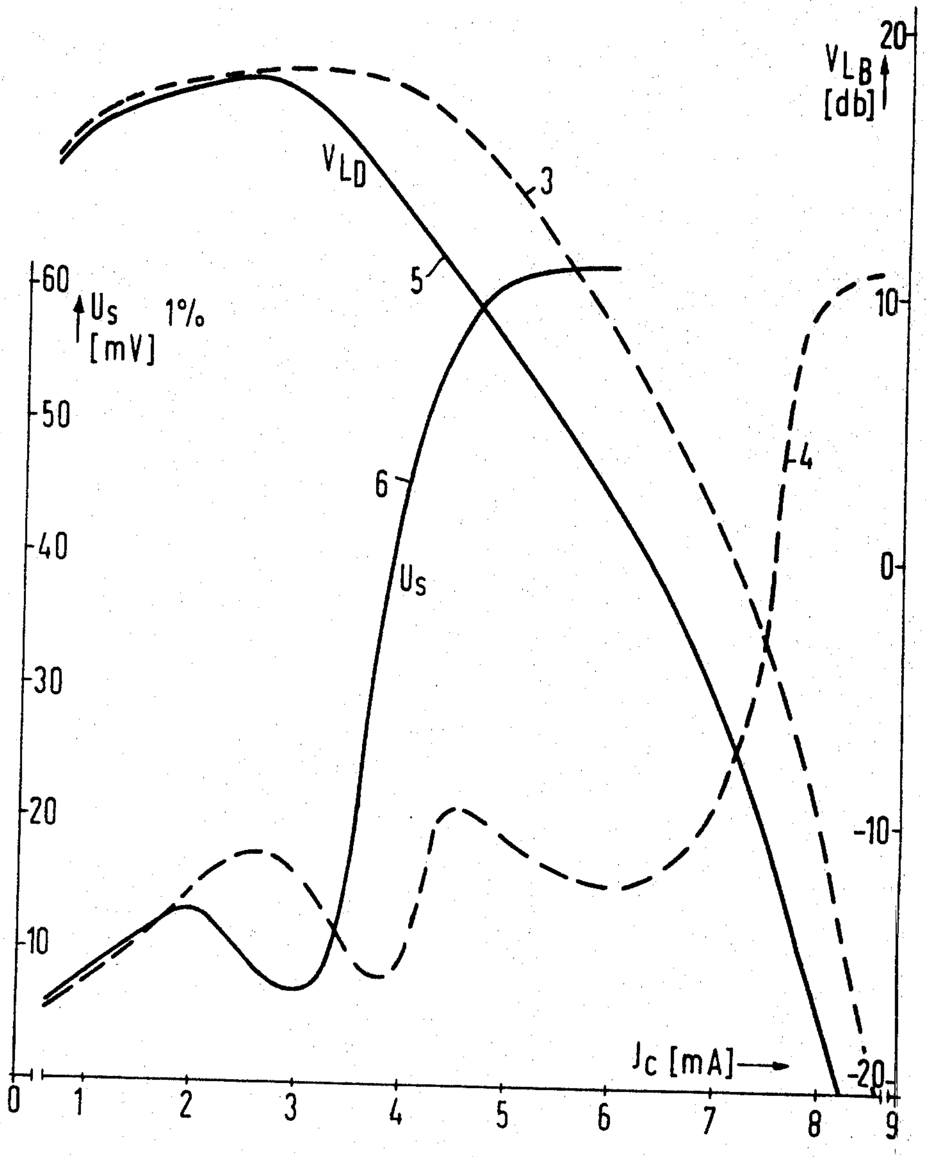
FIG. 6 is a graph of measuring results.

The diagram of FIG. 6 exhibits results obtained with transistors as described above with reference to FIGS. 4 and 5. The abscissa indicates collector current $I_C$ in ma., and the ordinate denotes voltage. The full-line curve 5 represents the amplifiaction characteristic $V_{LB}$. The full-line curve 6 indicates the permissible spurious voltage $U_s$. These curves were taken with a regulating transistor according to the invention in which the transverse current passing through the base region was 10 ma. In comparison thereto, the broken-line curve 3 indicates the amplifying characteristic, and the broken-line 4 the permissible spurious voltage for a base transverse current zero.

The measuring results shown in FIG. 6 were obtained with the aid of a measuring circuit, as illustrated in FIG. 7. Denoted by T in FIG. 7 is the transistor in base configuration. The signal arriving at the input E stemmed from a useful transmitter having a frequency of 200 mHz. (megacycles) which was not modulated, so that only the carrier frequency was received, and also from a transient transmitter having a frequency of 210 mHz. amplitude modulated 100% with one kHz. (kilocycle). The total input resistance $R_E$ was 60 ohms. The useful transmitter signal at the output A of the measuring circuit was 1% amplitude modulated by spurious (noise) voltage. The load resistance was 60 ohms and was transformed by means of a tank circuit S up to 900 ohms, for thus matching it to the output of the transistor T.

The resistors $R_1$ and $R_3$, of which $R_3$ is adjustable, form a voltage divider for the collector voltage supplied from a battery $B_1$ whose voltage is 12 v. Denoted by $C_1$ and $C_4$ are coupling capacitors. Further capacitors $C_2$ and $C_3$ serve blocking purposes. A battery $B_2$ supplies the base transverse current to the base electrode and the auxiliary electrode through an adjustable potentiometer rheostat $R_2$. The resistance of $R_1$, $R_2$, $R_3$ is 1K ohm each.

We claim:

1. An amplifying transistor device for regulating circuits, comprising a semiconductor body having a collector region on one face and having respective emitter and base regions with respective emitter and base electrodes located on the opposite face, an auxiliary electrode forming with said semiconductor body a barrier-free junction on said opposite face and being located on said base region near said emitter electrode at its side away from said base electrode, direct-voltage supply means connected to said base electrode and said auxiliary electrode for passing a transverse current through said base region, means for reducing said transistor high frequency amplifying gain with increasing collector current, said means comprising a dopant concentration $N_C$ in the collector region such that at a collector current of at most 10 ma. the collector current density $j_c$ is greater than $v_g \cdot qN_C$ wherein $v_g$ denotes the limit speed for charge carriers in the semiconductor at high field strengths, said limit speed amounting to about $3\text{–}6 \cdot 10^6$ cm./sec., $N_C$ denotes the dopant density in the collector region, $q$ denotes the elementary charge.

2. In a transistor device according to claim 1, said auxiliary electrode having its midpoint spaced from the common geometrical centerline of said emitter electrode and base electrode.

3. In a transistor device according to claim 1, said auxiliary electrode having its midpoint located on the common geometrical center line of said emitter electrode and base electrode.

4. A transistor device according to claim 1, comprising a plurality of component base electrodes spaced from each other and electrically short-circuited with each other.

5. In a transistor device according to claim 1, said direct-voltage supply means to provide a base transverse current of about 2 to about 50 ma.

6. An amplifying transistor device for regulating circuits, comprising a semiconductor body having a collector region on one face and having respective emitter and base regions with respective emitter and base electrodes located on the opposite face, an auxiliary electrode forming with said semiconductor body a barrier-free junction on said opposite face and being located on said base region near said emitter electrode at its side away from said base electrode, direct-voltage supply means connected to said base electrode and said auxiliary electrode for passing a transverse current through said base region, said transistor having a dopant concentration in the collector region such that at a collector current of at most 10 ma. said transistor exhibits a declining gain characteristic with increasing collector current.

References Cited

UNITED STATES PATENTS

| | | | |
|---|---|---|---|
| 2,924,760 | 2/1960 | Herlet | 317—235 |
| 3,087,098 | 4/1963 | Taylor | 317—235 |
| 3,226,613 | 12/1965 | Haenichen | 317—235 |

OTHER REFERENCES

Characteristics and Circuit Applications for a Tetrode Power Transistor by Marshall, Feb. 17, 1956, pp. 1–7 relied on.

JOHN W. HUCKERT, *Primary Examiner.*

J. D. CRAIG, *Assistant Examiner.*